United States Patent
Karrer et al.

(10) Patent No.: US 6,366,076 B1
(45) Date of Patent: *Apr. 2, 2002

(54) DEVICE WITH WIDE PASSBAND FOR MEASURING ELECTRIC CURRENT INTENSITY IN A CONDUCTOR

(75) Inventors: Nicolas Karrer, Zurich; Patrick Hofer-Noser, Bern, both of (CH)

(73) Assignee: Liaisons Electroniques-Mecaniques LEM SA, Plan-les-Ouates (CH)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/403,452
(22) PCT Filed: Apr. 21, 1998
(86) PCT No.: PCT/CH98/00155
  § 371 Date: Oct. 20, 1999
  § 102(e) Date: Oct. 20, 1999
(87) PCT Pub. No.: WO98/48287
  PCT Pub. Date: Oct. 29, 1998

(30) Foreign Application Priority Data

Apr. 21, 1997 (CH) .................... 0910/97
Oct. 22, 1997 (CH) .................... 2459/97

(51) Int. Cl.$^7$ ............. G01R 33/00; G01R 1/14
(52) U.S. Cl. ............. 324/117 R; 324/126; 324/127
(58) Field of Search ............. 324/117 R, 126, 324/127

(56) References Cited

U.S. PATENT DOCUMENTS

| 4,473,810 | A | * | 9/1984 | Souques et al. | ............. 336/115 |
| 4,616,176 | A | * | 10/1986 | Mercure et al. | ............. 324/127 |
| 4,831,327 | A | * | 5/1989 | Chenier et al. | ............. 324/127 |
| 4,904,873 | A | * | 2/1990 | Kuhn | ............. 250/424 |
| 4,933,630 | A | * | 6/1990 | Dupraz | ............. 324/127 |
| 5,015,945 | A | * | 5/1991 | Randun | ............. 324/127 |
| 5,296,802 | A | * | 3/1994 | Beranger et al. | ............. 324/117 R |
| 5,343,143 | A | * | 8/1994 | Voisine et al. | ............. 324/142 |
| 5,438,257 | A | * | 8/1995 | Berkcan | ............. 324/117 R |
| 5,463,313 | A | * | 10/1995 | Berkcan | ............. 324/117 R |
| 5,521,782 | A | * | 5/1996 | Zieve | ............. 361/42 |
| 5,565,765 | A | * | 10/1996 | Lenhard | ............. 324/117 R |
| 5,834,934 | A | * | 11/1998 | Baurand et al. | ............. 324/127 |

FOREIGN PATENT DOCUMENTS

| CH | 677034 A5 | * | 12/1987 | ............. G01R/17/00 |
| EP | 0699916 A1 | * | 2/1995 | ............. G01R/31/00 |
| JP | 07043441 | * | 2/1995 | ............. H01L/39/22 |
| WO | WO 97/03337 | * | 1/1997 | ............. G01B/7/00 |

* cited by examiner

Primary Examiner—Glenn W. Brown
Assistant Examiner—Wasseem H. Hamdan
(74) Attorney, Agent, or Firm—Clifford W. Browning; Woodard, Emhardt, Naughton, Moriarty & McNett

(57) ABSTRACT

The current to be measured (I) passes in a conductor (1) enclosed with a Rogowski coil (4) and in the proximity thereof are arranged several magnetic field detectors (3). The sum of the signals from these detectors, formed in the device (2), and the signal supplied by the Rogowski coil are applied to a signal processor (7). The processor (7) comprises, for example, a first order delay device connected to the Rogowski coil output and means for amplifying/reducing the signals followed by adding means, the delay time constant and the amplifying/reducing factors being selected so that the device output (8) signal is proportional to the intensity of the current to be measured in a very wide frequency range, i.e. from 0 to more than 10 MHz.

36 Claims, 6 Drawing Sheets

DEVICE WITH WIDE PASSBAND FOR MEASURING ELECTRIC CURRENT INTENSITY IN A CONDUCTOR

The present invention aims at providing a device for measuring the intensity of electrical current passing through a conductor which allows measurement, with great accuracy, of continuous current as well as high frequency current, i.e., a device having a passband from zero to more than 10 MHz.

To this end, the device according to the invention is characterized in that it comprises, on one hand, a measuring coil closed on itself, without a magnetizable core, surrounding at least partially the said conductor and adapted to provide a first measurement signal and, on the other hand, at least one measuring resistor traversed by the current to be measured or at least one magnetic field detector arranged in proximity to said conductor, adapted to provide a second measurement signal, the measuring device comprising a circuit for processing said first and second measurement signals so as to provide an output signal which is an image of the current to be measured.

The invention seeks moreover to enable miniaturization of the measuring device, and, according to a preferred embodiment, measurement without galvanic coupling between the current and the output signal.

Particular embodiments of the device according to the invention are indicated in the claims 2 to 13 and other aspects, objectives and advantages of the invention will become apparent from the description which follows and from the annexed drawings.

Measuring methods using a Rogowski's coil are already known, for example from the publication "Rogowski Transducers for High Current Measurement" by W. F. Ray, "IEE Colloquium on Low Frequency Power Measurement and Analysis, London, 1994, pg. 10/1–10/6, and the documents FR-A-2695482 and U.S. Pat. No. 5,442,280, these methods however not permitting the measurement of continuous current or of continuous current components.

Other known methods for measuring current use the measurement of the magnetic field created by a conductor through which the current flows, by means of field detectors such as Hall detectors or magneto-resistive elements (cf. DE 36 05 719 and DE 35 17 095, and the publication by L. Ghislanzoni "MAGNETIC COUPLED CURRENT SENSING TECHNIQUES FOR SPACECRAFT POWER SYSTEMS", Proceedings of the European Space Power Conference Oct. 2–6, 1989, Madrid, Spain). Without channelling the flux by means of magnetic materials with high permeability, the corresponding measurement signals are however very weak. Thus, the capacitive coupling and the parasitic fields may generate signals of an amplitude attaining a multiple of that of the measurement signal, for example in the case of switching by semi-conductor switches leading to rates of voltage variation in the order of several thousands of volts per micro-second. To increase the measurement signal as well as the signal/noise ratio, the conductor may be surrounded by a magnetic circuit with an air-gap. One measures in this case the magnetic field inside the air-gap, for example by means of a compensating device regulating the flux in the magnetic circuit to zero with the help of a supplementary winding. Nevertheless, the upper frequency limit of such current sensors with compensation is generally less than 1 MHz. Moreover, the cross-section of the magnetic circuit that is needed increases with the intensity of the current and therefore reduces the scope of miniaturization.

In methods in which one measures the voltage drop on conductors or resistors traversed by the current, the losses which increase proportionally with the effective value of the current, the conductive coupling between the measurement signal and the current to be measured, as well as the costly mechanical design that these methods imply, represent major inconveniences. A method of this type is the subject of a publication by Adolf Schwab "Die Berechnung der Bandbreite und der Anstiegszeit rohrförmiger koaxialer Messwiderstände unter Berücksichtigung der Stromverdrängung" (ETZ—A vol. no. 89, pg. 604 ff).

The present invention which purports to overcome the disadvantages of the above mentioned methods and devices, will be better understood with regard to the description given hereafter of the different embodiments, indicated as examples, with reference to the annexed drawings, in which.

Figure 1:
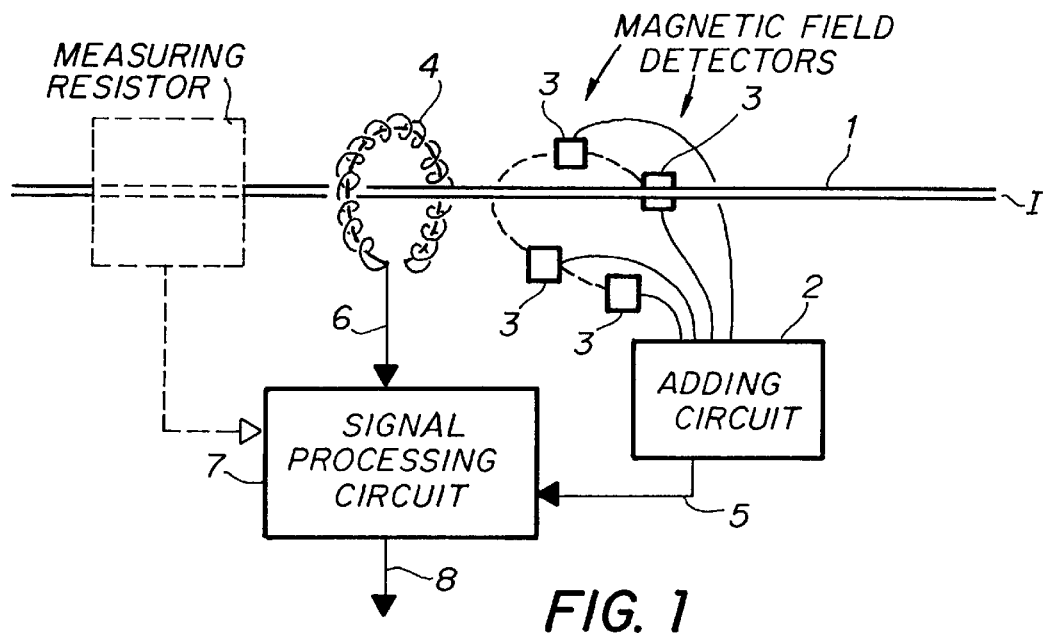
FIG. 1 is a diagram of principle of the device according to the invention.

According to the diagram of FIG. 1, the current I passing in a conductor 1 is measured, on one hand, by an air coil 4, closed on itself, arranged around the conductor 1, known as a Rogowski coil, and, on the other hand, by many—here four—magnetic field detectors 3, such as the Hall effect detectors or magneto-resistive detectors whose output signals are added in a circuit 2 to form a measurement signal. This signal which appears on a conductor 5 is sent to a first input of a signal processing circuit 7, whose other input receives, through a conductor 6, the measurement signal of the coil 4. The output signal of the circuit 7 appears on a conductor 8.

It is to be noted that the field detectors are preferably placed in the proximity of the primary conductor 1 without the magnetic flux being concentrated at their position by a circuit or elements of magnetically permeable material. This enables avoiding the influence of such a circuit or such elements on the behavior of the measuring device as well as the primary circuit which must, in certain applications, be able to be commuted very quickly.

Figure 2:
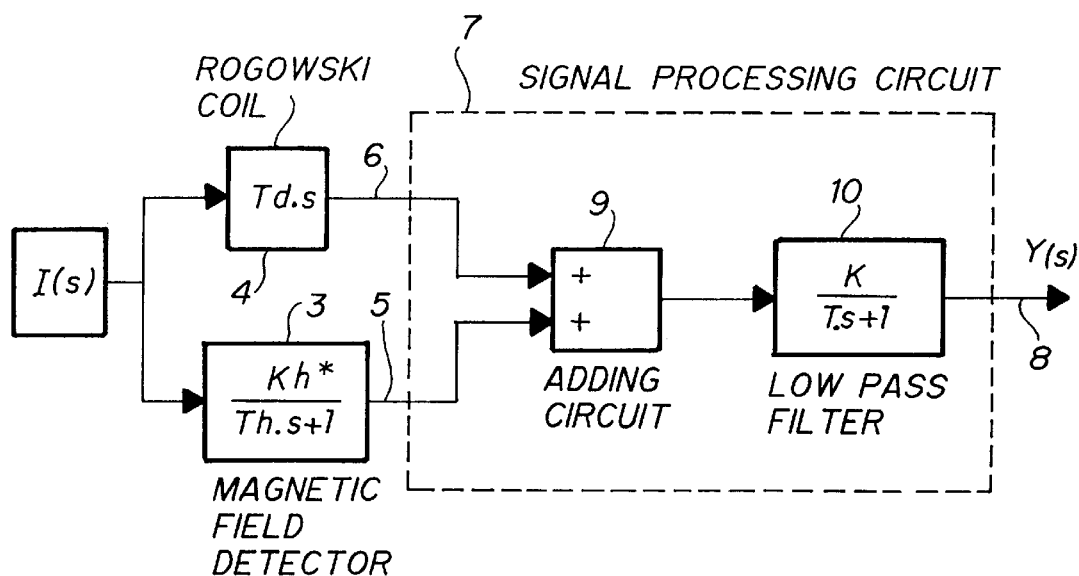
FIG. 2 is a block diagram illustrating a first embodiment.

FIG. 2 illustrates an embodiment of the present device by a diagram in which the measurement signals are described by their Laplace transformation, s representing the Laplacian operator, I(s) the Laplace transformation of the current I and Y(s) the output signal of the measuring device.

The Rogowski coil gives a proportional voltage to the rate of change of the current I, this voltage being expressed, in the relevant frequency range, by $$Ur(s)=s \cdot Td \cdot I(s) \qquad (2),$$

where Td is a constant depending on the shape and the material of the coil. The field detectors 3 supply, on the conductor 5, a signal of limited frequency band, which can be described as $$Uh(s)=Kh^* \cdot I(s)/(1+s\,Th) \qquad (3),$$

where Kh* designates a constant which depends in particular on the type and number of field detectors. The denominator of expression (3) describes the limitation of the frequency band of this measurement signal.

In the circuit 7 of FIG. 2, the measurement signals are added in the device 9 and the resulting signal is applied to a first order delay device with time constant T. K represents the amplification of the signal in this device. The output signal on the conductor 8 hence becomes $$Y(s)=I(s)\,[s^2 \cdot Td \cdot Th \cdot K + Td \cdot K \cdot s + Kh^* \cdot K]/[s^2 \cdot T \cdot Th + (Th+T) \cdot s + 1] \qquad (4),$$

If one determines the constants in such a manner that the numerator and the denominator of the multiplier of I(s) become at least approximately equal, the transfer function becomes at least approximately equal to one and Y(s) represents a true image of I(s). In most cases, it will suffice that the condition Th<<T be satisfied in order to obtain an output signal having the desired precision.

Figure 3:
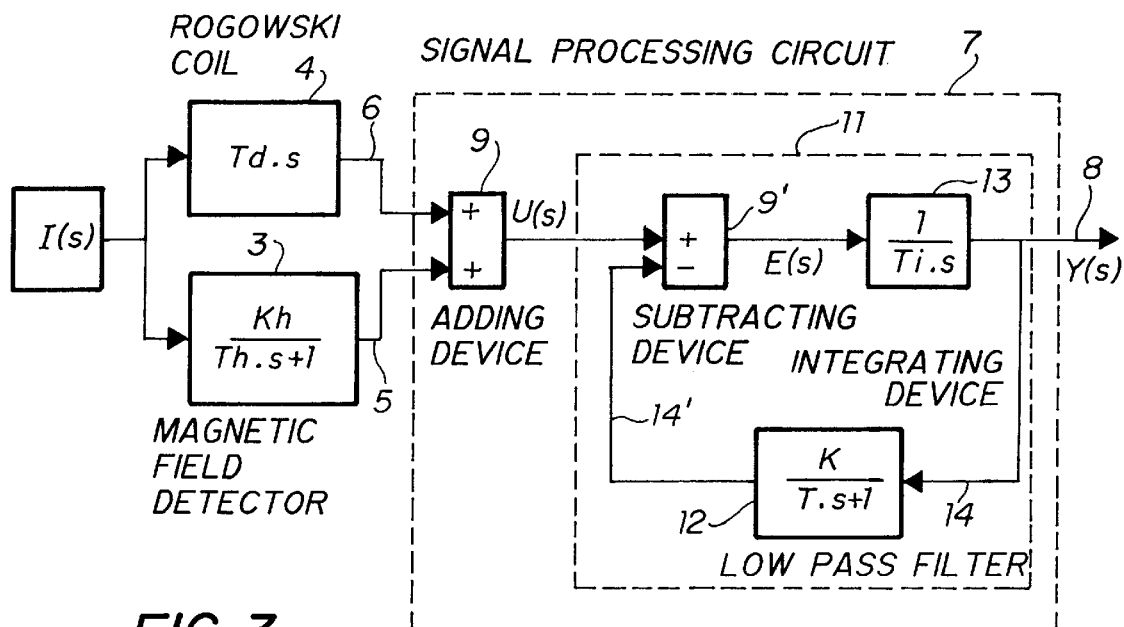
FIG. 3 is a block diagram illustrating another embodiment.

In the more detailed embodiment of FIG. 3, which reuses the same notations as that of FIG. 2, the device 10 of the circuit 7 is replaced by a device 11 with control loop. The output measurement signal U(s) of the adding device 9 is applied to the positive input of a subtracting device 9" whose output is attached to an integrating device 13. The output of 13 is coupled with the negative input of the device 9' through conductors 14, 14' by way of a delay device 12 similar to the device 10 of FIG. 2. The signal E(s) is the error signal appearing at the output of 9' and the transfer function of the device 11 has the following form:

$$Y(s)/U(s)=(1+sT)/[(1+sT)\cdot s \, Ti + K] \qquad (5),$$

where T is the time constant of the delay device, K is the amplification in the control loop, and Ti is the integration time constant of the integrating device 13.

Using the forms of the measurement signals according to expressions (2) and (3) mentioned above, one can calculate the transfer function of the measuring device which becomes $$Y(s)/I(s)=[s \cdot Td(1+s \cdot Th)+Kh^*](1+s \cdot T)/\{(1+sTh)[s \cdot Ti \cdot (1+s \cdot T)+K]\} \qquad (6)$$

If it is possible to choose the parameters in such a manner that the conditions Td=Ti, T=Th and K=Kh* are satisfied, the value of this transfer function becomes equal to one and the output signal becomes a true image of the current to be measured. The upper frequency limit is determined by the arrangement of the Rogowski coil and of the integrating device. The lower frequency limit is equal to zero.

Figure 4:
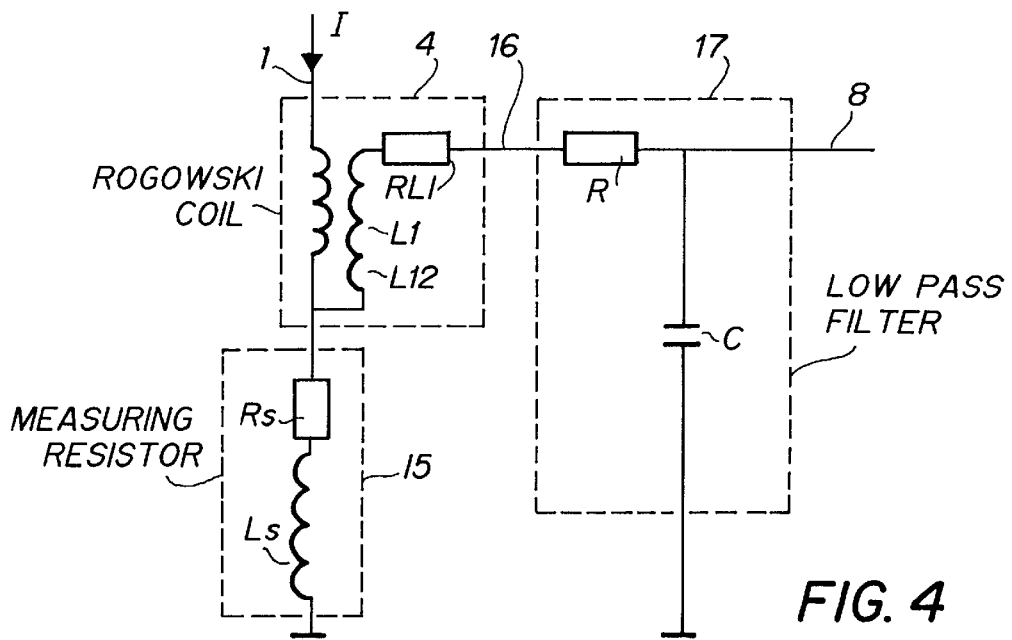
FIG. 4 is a diagram of a simple measuring device.

FIG. 4 shows a very simple measuring device according to the diagram of FIG. 2 in which the measurement signals are added by the series connection of the coil 4 and a measuring resistor 15. The Rogowski coil 4 has an internal resistance RL1, an auto-inductance L1 and a mutual inductance L12. The measuring resistor 15 has an ohmic value Rs and self-inductance Ls. The sum of the voltage drop in the resistor 15 and of the induced voltage in the coil 4 appears on the conductor 16 and is applied to a first order delay device 17, in this case a low pass filter formed by a resistor R and a capacitor C. On the conductor 8 appears an output signal of the type:

$$Y(s)=I(s) \cdot [s(L12+Ls)+Rs]/[s^2 C(L1+Ls)+sC(RL1+Rs+R)+1] \qquad (7).$$

If it is possible to choose the constants in such a manner that the transfer function Y(s)/I(s) is at least approximately equal to one, the output signal becomes a true image of I(s). The major disadvantage of such a device is the galvanic coupling between the conductor 1 of the current to be measured and the output conductor 8.

Figure 5:
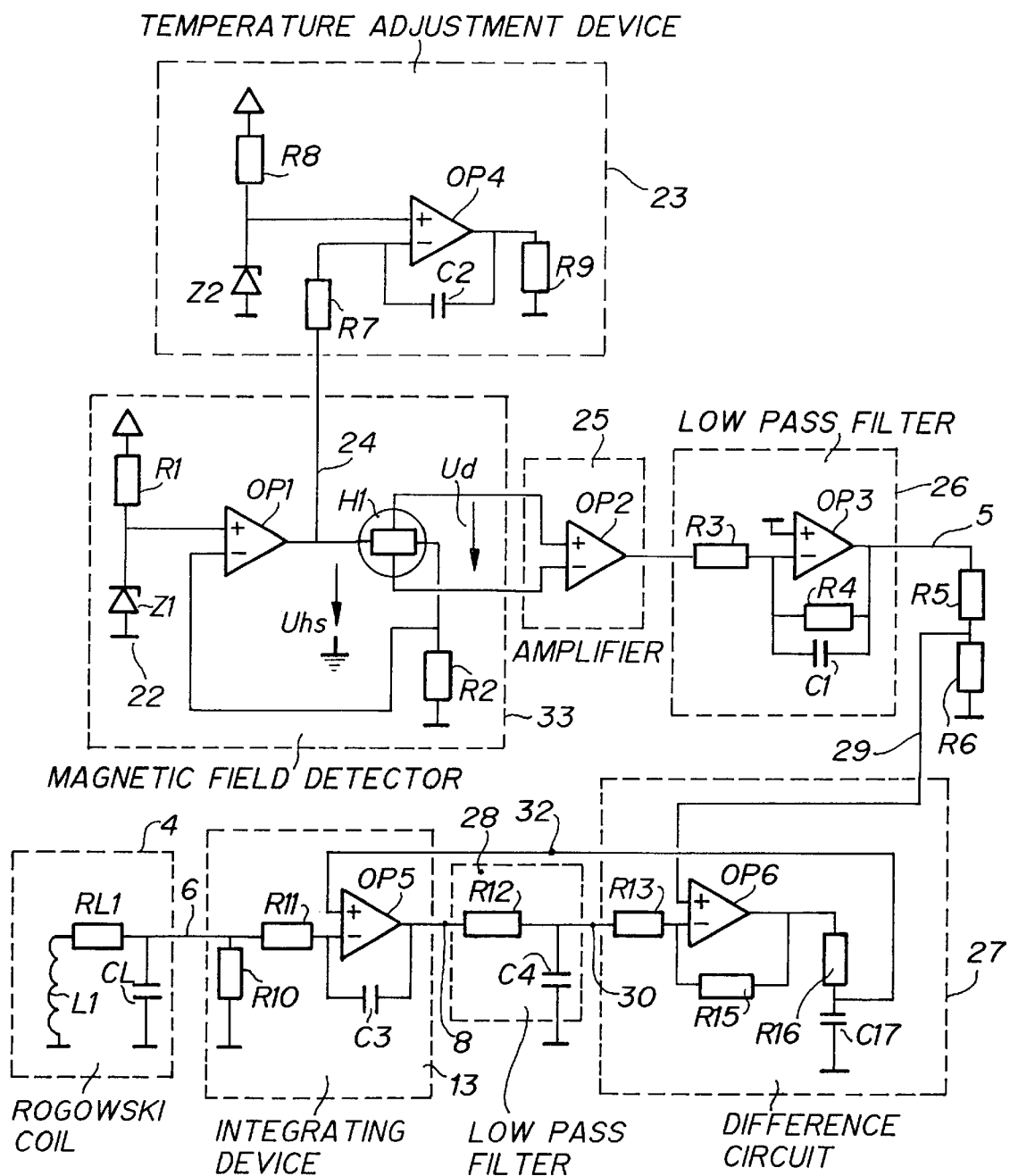
FIG. 5 is a detailed diagram of an embodiment of a device according to the invention.

The embodiment represented more in detail in FIG. 5 executes a transfer function similar to the embodiment of FIG. 3 and similar elements are shown with the same reference numbers as previously. The magnetic field detectors in the form of Hall detectors which correspond to the detectors 3 of FIG. 1 and of which only one, H1, is represented in block 33, each supply a voltage Ud proportional to the low frequency components of the current I passing in the conductor 1 of FIG. 1. The output voltages of the different Hall detectors are amplified in respective amplifiers such as OP2 represented in block 25, then added in a manner not represented. The resulting signal is applied to a first order delay device with amplification 26 comprising a resistor R3 and an operational amplifier OP3 with resistors R4 and C1. The frequency limit of the device 26 being clearly lower than the frequency limit of the signal of the detectors 33, the transfer function of the set 33, 25 and 26, supplying one of the measurement signals of the device to the conductor 5, can be written as $$Gh(s)=-Kh \cdot R4 \cdot Kd/[R3(1+s \cdot C1 \cdot R4)] \qquad (8),$$

where the constant Kh represents the internal amplification of the Hall detectors and Kd the amplification in block 25.

The other measurement signal is supplied by the Rogowski coil represented in block 4 by its inductance L1, its ohmic resistance RL1 and its internal capacitance CL. The measurement signal on the conductor 6 is supplied to block 13 which forms an integrating device with subtraction and comprises the resistors R10, R11 and an operational amplifier OP5 with a capacitor C3. To obtain a sufficiently quick integration, the operational amplifier OP5 must have a very wide passband and may consist, for example, of an amplifier composed of elements called "Diamond Transistor" according to the nomenclature of the company Burr Brown (Applications Handbook 1994, pages 257 ff.), of a transimpedance-amplifier or of a wide band amplification unit composed of a plurality of amplifiers. The input impedance of the amplifier OP5 must be adapted to the Rogowski coil, this adaptation being effected for example by means of a passive circuit.

On the conductor 8, at the output of block 13, appears the output signal of the measuring device. This signal is supplied in a manner similar to the diagram of FIG. 3 by the intermediary of a delay device 28, consisting of a low pass filter comprising a resistor R12 and a capacitor C4, to a device 27 whose output signal is brought back to the amplifier OP5 by a liaison 32 ending at the positive input of this amplifier. The device 27 generates the difference between the measurement signal Ur appearing on the conductor 30 and the measurement signal Uh appearing on the conductor 29 after division, by the resistors R5 and R6, of the measurement signal on the conductor 5. The resistors R13, R15 and R16 as well as a capacitor C17 are part of the device 27, as is shown in the diagram of FIG. 5, the values of R16 and C17 being respectively equal to that of R11 and C3.

The transfer function Y(s)/I(s) of the device of FIG. 5 hence becomes $$Y(s)/I(s)=-\{[s \cdot L1 \cdot R10(1+s(C1 \cdot R4)/(R10+RL1)]$$
$$+Kh \cdot Kd \cdot R4 \cdot R6(R13+R15)/R3 \cdot R13 \cdot (R6+R5)\}$$

$(1+sC4 \cdot R12)/\{(1+s \cdot C1 \cdot R4)[s \cdot C3 \cdot R11 \cdot (1+s \cdot C4 \cdot R12)+R15/R13]\}$ (9).

The comparison with the coefficients of expression (6) shows that $Td = L1 \cdot R10/(R10+RL1)$ $Kh^* = Kh \cdot Kd \cdot R4 \cdot R6 \cdot (R13+R15)/[R3 \cdot R13 \cdot (R6+R5)]$ $Th = C1 \cdot R4$ $Ti = C3 \cdot R11$ $T = C4 \cdot R12$ $K = R15/R13$.

According to FIG. 5, the output signal is inversed with respect to the input signal. The sign of the output signal can be reversed by an inverting device at the output, or by inversion of the inputs of the integrator.

The diagram of FIG. 5 also shows the power supply of the Hall detectors from a constant current source carried out by the diagram of block 33 where R1 and R2 are resistors, Z1 a Zener diode and OP1 an operational amplifier. The power supply paths of the different Hall detectors are connected in series. The supply current being constant, the voltage appearing at the output of the operational amplifier 1 as compared to ground 22, Uhs, is proportional to the temperature of the Hall detectors and can be utilized for the control of a temperature adjustment device 23. The device 23 comprises a heating resistor R9 comprising series or parallel mounting of a plurality of partial resistors supplied with power by an operational amplifier OP4, or as the case may be, by a power amplifying device. The value of the observed temperature is determined by a voltage divider consisting of a resistor R8 and a Zener diode Z2. The voltage Uhs is provided by a conductor 24 and a resistor R7 at the negative input of the operational amplifier OP4/C2. According to an alternative embodiment, a separate temperature detector could supply the control signal for the device 23. Other means of temperature stabilization can equally be utilized, such as a measuring bridge comprising the Hall detector and, in series, a resistor sensitive to temperature having the same characteristics as a function of the temperature, the potential difference in the diagonal of the bridge forming the measurement signal Ud.

Figure 6A:
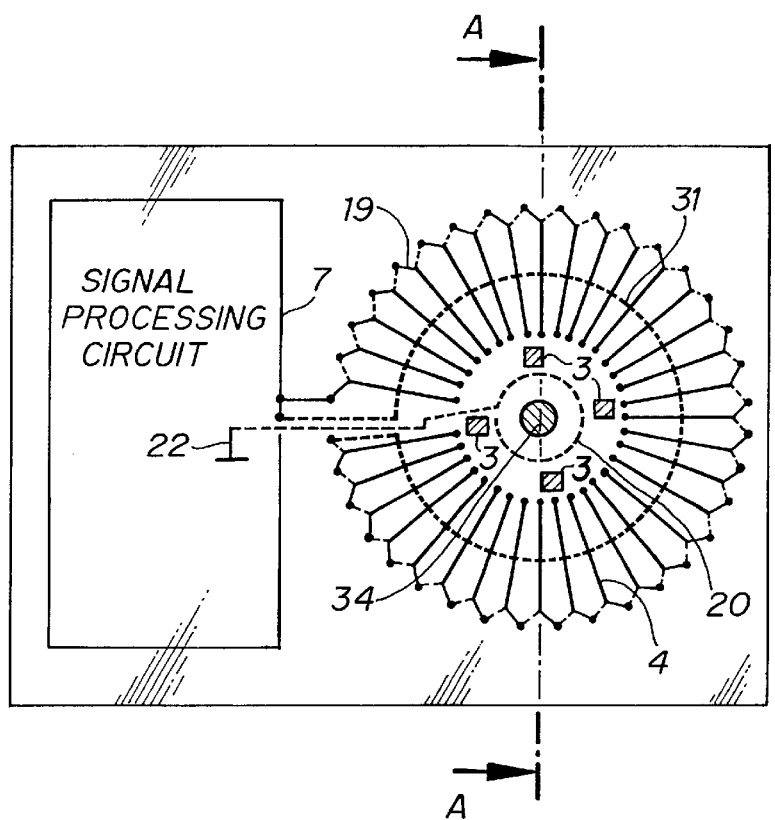
FIGS. 6a and 6b are front and lateral views of a construction of a device according to the invention.
Figure 6B:
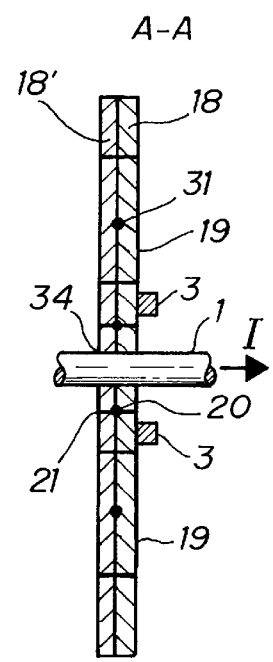

FIGS. 6a and 6b show a preferred construction of the measuring device according to the invention. The Rogowski coil 4 is executed in the form of a circuit 19 printed on a substrate, for example in two reunited parts 18, 18', the return conductor 31 of the coil thus being arrangeable in the center of the coil. Hall detectors or other magnetic field detectors 3 are arranged on the same substrate, and placed regularly around the central opening 34 through which the conductor 1 passes. The device further comprises a conductive track 20 encircling the opening 34, with contact portions 21 crossing the substrate, the assembly being connected to ground for shielding against parasitic capacitive coupling. The Rogowski coil 4 has a homogenous structure to minimize the influence of external parasitic fields. The signal processing electronic circuit 7 is preferably provided on the same substrate as the Rogowski coil and the field detectors. The conductive tracks can be formed on a rigid or flexible substrate and are preferably configured in such a manner that they form an integral assembly allowing the device to be opened for its installation around the conductor 1.

The embodiments of the signal processing circuit described above aim to solve the problem of measuring continuous current by means of a device enabling measurement of the high frequency current, i.e. a Rogowski coil or an air-coil. As such a coil does not supply a measurement signal at zero frequency, the integrating device that is generally used should maintain its output signal constant in the vicinity of this point. The integrating device however does not have an ideal behavior. It generally comprises one or more operational amplifiers which must have a bandwidth as large as possible, very low leakage and polarization currents, and a very large variation of the output and input voltages. Moreover, these amplifiers generally have a high amplification in the vicinity of zero frequency. The output signal will practically always have the tendency to drift.

The solution according to FIGS. 3 and 5 which consists of effecting a measure of the magnetic field generated by the current to obtain a second measurement signal in the domain of low frequencies and to utilize a control loop to compensate for this inherent fault of the integrating device, turns out to be relatively expensive and difficult to execute industrially, particularly because of its temperature dependence and the problem of stability of the control loop.

FIGS. 7 to 10 illustrate an alternative solution enabling utilization of an integrating device having a behavior as close as possible to ideal behavior and obtaining, by relatively simple means, an output signal Y(s) proportional to the current I(s) to be measured in the range of frequencies from zero to the resonance frequency of the measuring coil.

Figure 7:
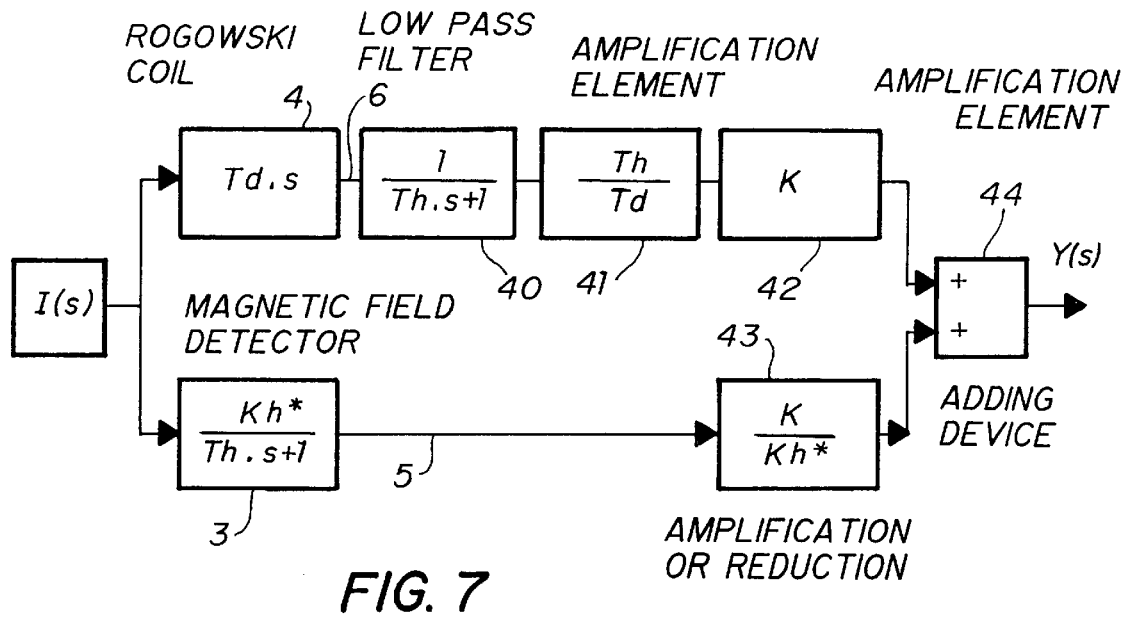
FIG. 7 is a block diagram illustrating another embodiment of a device according to the invention.
Figure 8:
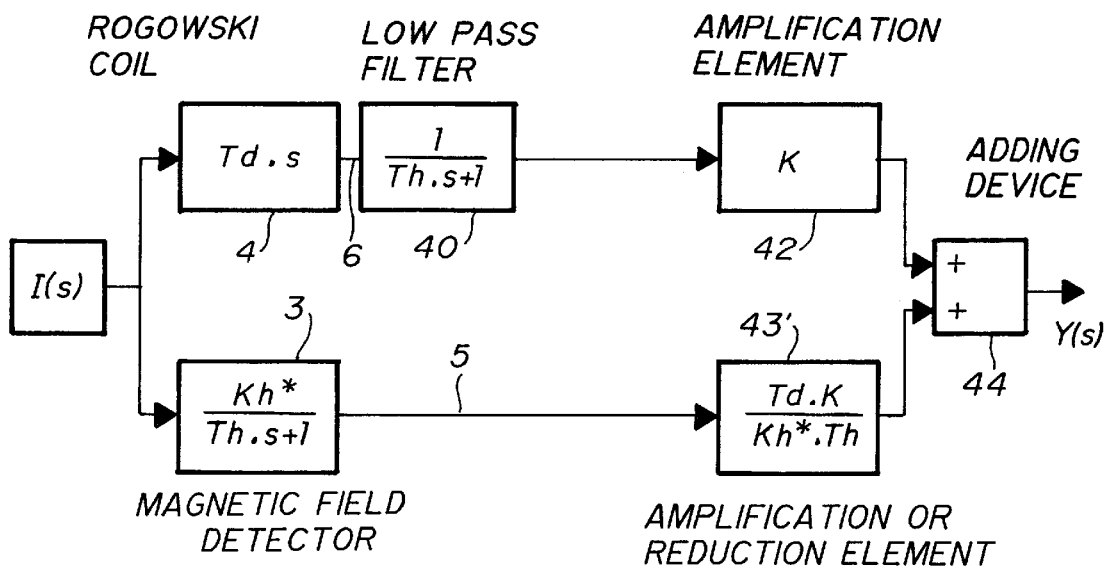
FIG. 8 is a block diagram illustrating an embodiment similar to that of FIG. 7.

The synoptic diagrams of FIGS. 7 and 8 show respectively two variants of this solution in which the signal sources are considered to be ideal, in a manner analogue to FIG. 2, and the same reference numbers and symbols are used for the elements and signals corresponding to those of FIG. 2.

According to FIG. 7, the measurement signal 6 is applied to a first order delay device 40 and then to amplification elements 41, 42 separated or united. In the case where device 40 is an active element, the amplification functions of 41 and 42 can be provided by this element.

The measurement signal 5 is amplified or reduced in the device 43 depending on the choice of constant K as a function of the desired output signal amplitude.

The signals hence transformed are added in an adding device 44 to supply the output signal Y(s).

According to FIG. 8, the amplification function of the element 41 of FIG. 7 is retaken, in an inverse manner, in the amplifier/reducer element 43' arranged in place of the element 43 of FIG. 7.

One easily notes that the transfer function of the measuring device becomes, in the case of FIG. 7, Y(s)/I(s)=K, and in the case of FIG. 8, Y(s)/I(s)=K·Td/Th.

Figure 9:
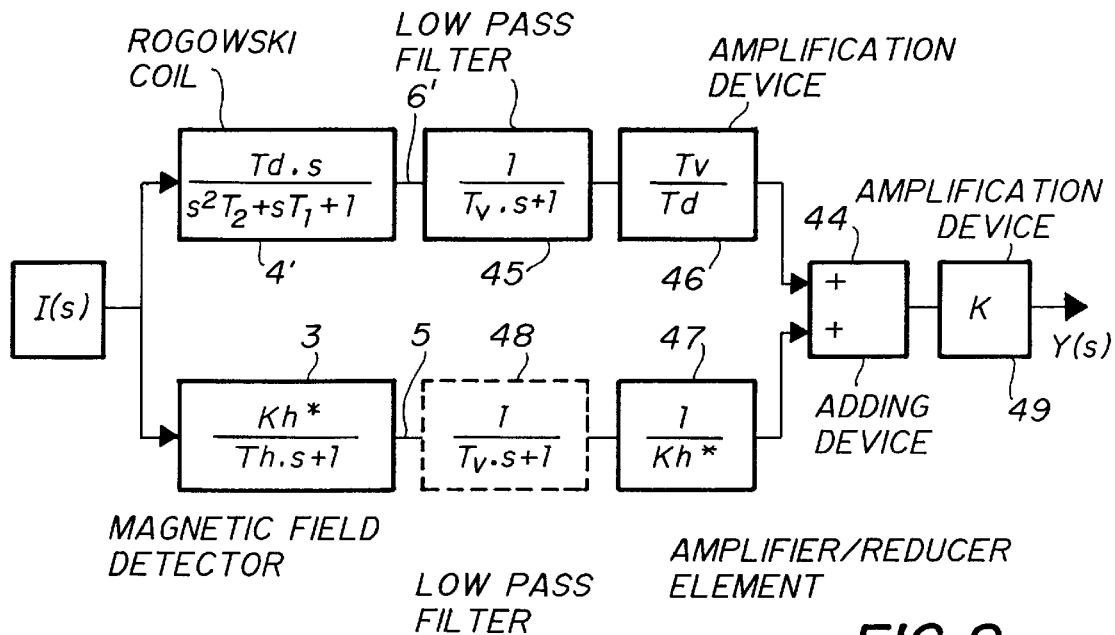
FIG. 9 is a block diagram illustrating another embodiment of a device according to the invention.
Figure 10:
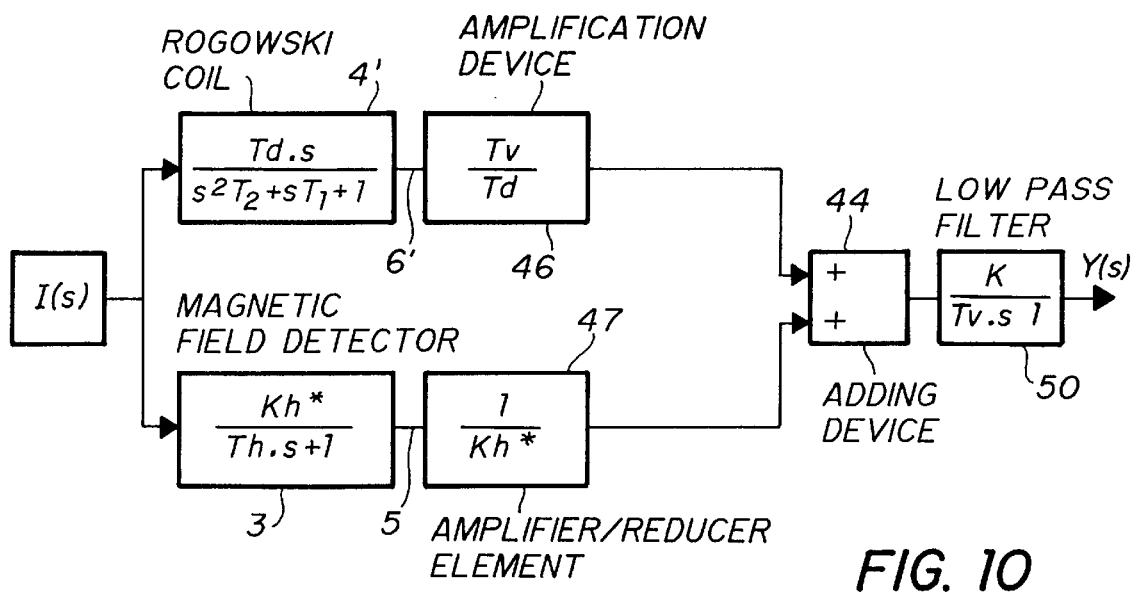
FIG. 10 is a block diagram illustrating an embodiment similar to that of FIG. 9.

FIGS. 9 and 10 illustrate two other variants of such a measuring device, the measuring coil being represented by a transfer function according to the expression figuring in blocks 4", constituting an approximation up to frequencies greater than tens of MHz. A Rogowski coil or an air-coil shows an ideal differentiator behavior up to frequencies of approx. 100 MHz, depending on the construction of the coil. For higher frequencies, the capacitive coupling between the turns of the winding gives it the behavior of an integrator.

For the functioning of the measuring device, it is important that the upper frequency limit below which the coil acts like a differentiating element be higher than the frequency of the field detector which has a low pass filter characteristic. This condition is generally satisfied with present Hall effect detectors and a well designed Rogoswki coil.

In the diagram of FIG. 9, the measurement signal 6' is applied to a first order delay device 45 having a time constant Tv, and is subjected to an amplification of factor Tv/Td in block 46, this function being incorporable in the device 45. The measurement signal 5 can be applied directly to an amplifier/reducer element 47, if Tv=Th.

In the case where the frequency limit of the detector 3 is situated two or three decades over that of the device 45, one can provide a time delay with a device 48 identical to device 45. As the provision of two identical devices may be difficult, a circuit according to FIG. 10 is generally preferred.

The transformed signals are added in a device 44 and amplified, for example by the device 49 of FIG. 9. This function can also be incorporated in the device 44 or in the devices 46 and 47.

In the embodiment according to FIG. 10, the time delay is effected at the output of the adding device 44, for example by an active device 50 which produces the delay as well as an amplification of factor K. The functions of the other blocks with the same name are similar to that of FIG. 9.

In practical executions, because of non-ideal behavior of the measurement signal sources and of the other elements of the measuring device, the output signal will not be a perfect image of the current to be measured in the whole range of frequencies. Nevertheless, the frequency characteristic of such a device corresponds to that of a low-pass filter with a frequency limit around the resonance frequency of the Rogoswki coil. A damping resistor is preferably connected to the output of this coil so as to dampen the signal at the resonance frequency.

The solution described with the help of the examples of FIGS. 7 to 10 thus enables provision of a constant transfer function in a very large range of frequencies, including zero frequency, by means of devices which can be easily controlled and that are cost effective.

From comparative measurements effected with a device according to the invention and with a commercial current transformer having a frequency limit higher than 20 MHz, it has been observed that the respective dynamic properties did not present any differences. Moreover, measurement of the continuous current up to 300 A would show a maximum error of 2% with respect to measurement by means of a high precision resistor.

What is claimed is:

1. A device for measuring the intensity of electric direct and alternating current passing through a conductor (1), comprising a measuring coil (4) without a magnetizable core surrounding said conductor (1) at least partially and adapted to provide a first measurement signal proportional to the time derivative of the current to be measured, and at least one measuring resistor through which the current to be measured flows, or at least one magnetic field detector (3) capable of detecting time independent magnetic fields arranged in the vicinity of said conductor (1), adapted to provide a second measurement signal proportional to the current to be measured, the device further comprising a circuit (7) to process said first and second measurement signals comprising a first order low-pass filter connected to the output of said measuring coil and a signal adding device for adding said first filtered and second measurement signals, the time constant of said low-pass filter being chosen in such a way that the output signal of the adding device is proportional to the intensity of the current to be said circuit, further comprising at least one amplification or reduction device arranged between the output of said first order low-pass filter and a first input of said adding device and/or between the output of said magnetic field detector and a second input of said adding device measured.

2. A device according to claim 1, wherein said measuring coil is a Rogowski coil and said magnetic field detector (3) is a Hall effect detector or a magneto-resistive element.

3. A device according to claim 2, comprising a plurality of magnetic field detecting elements (3) arranged around said conductor (1).

4. A device according to claim 3, wherein said Rogowski coil (4) is realized on a circuit board (19) carrying electric conductors forming a regular coil (18, 18') around a central opening (34) and a substantially circular median return coil (31), the magnetic field detectors (3) being assembled on the same circuit board (19) as the coil.

5. A device according to claim 4, wherein said circuit board (19) comprises a shielding conductor (20) surrounding said opening passage (34) without forming a complete loop.

6. A device according to claim 5, wherein said shielding conductor is connected to conducting portions extends across said circuit board.

7. A device according to claim 4, wherein said circuit board is formed from at least two juxtaposed layers carrying the winding turns of the Rogowski coil, the return conductor of the latter being arranged along the inside of the turns, in the plane of contact of the two layers.

8. A device for measuring the intensity of electric direct and alternating current passing through a conductor (1), comprising a measuring coil (4) without a magnetizable core surrounding said conductor (1) at least partially and adapted to provide a first measurement signal proportional to the time derivative of the current to be measured, and at least one measuring resistor through which the current to be measured flows, or at least one magnetic field detector (3) capable of detecting time independent magnetic fields arranged in the vicinity of said conductor (1), adapted to provide a second measurement signal proportional to the current to be measured, the device further comprising a circuit (7) to process said first and second measurement signals comprising an adding device for adding said first and second measurement signals and a first order low-pass filter connected to the output of said adding device, the time constant of said low-pass filter being chosen in such a way that the output signal of the low-pass filter is proportional to the intensity of current.

9. A device according to claim 8, wherein said coil is a Rogowski coil and said magnetic field detector (3) is a Hall effect detector or a magneto-resistive element.

10. A device according to claim 9, comprising a plurality of magnetic field detecting elements (3) arranged around said conductor (1).

11. A device according to claim 10, wherein said Rogowski coil (4) is realized on a circuit board (19) carrying electric conductors forming a regular coil (18, 18') around a central opening (34) and a substantially circular median return coil (31), the magnetic field detectors (3) being assembled on the same circuit board (19) as the coil.

12. A device according to claim 11, wherein said circuit board (19) comprises a shielding conductor (20) surrounding said opening passage (34) without forming a complete loop.

13. A device according to claim 12, wherein said shielding conductor is connected to conducting portions extending across said circuit board.

14. A device according to claim 11, wherein said circuit board is formed from at least two juxtaposed layers carrying the winding turns of the Rogowski coil, the return conductor of the latter being arranged along the inside of the turns, in the plane of contact of the two layers.

15. A device according to claim 8, further comprising at least one amplification or reduction device arranged between the output of said first measurement signal and a first input of said adding device and/or between the output of said magnetic field detector and a second input of said adding device.

16. A device according to claim 15, wherein said coil is a Rogowski coil and said magnetic field detector (3) is a Hall effect detector or a magneto-resistive element.

17. A device according to claim 16, comprising a plurality of magnetic field detecting elements (3) arranged around said conductor (1).

18. A device according to claim 17, wherein said Rogowski coil (4) is realized on a circuit board (19) carrying electric conductors forming a regular coil (18, 18') around a central opening (34) and a substantially circular median return coil (31), the magnetic field detectors (3) being assembled on the same circuit board (19) as the coil.

19. A device according to claim 18, wherein said circuit board (19) comprises a shielding conductor (20) surrounding said opening passage (34) without forming a complete loop.

20. A device according to claim 19, wherein said shielding conductor is connected to conducting portions extending across said circuit board.

21. A device according to claim 18, wherein said circuit board is formed from at least two juxtaposed layers carrying the winding turns of the Rogowski coil, the return conductor of the latter being arranged along the inside of the turns, in the plane of contact of the two layers.

22. A device for measuring the intensity of electric direct and alternating current passing through a conductor (1), comprising a measuring coil (4) without a magnetizable core surrounding said conductor (1) at least partially and adapted to provide a first measurement signal proportional to the time derivative of the current to be measured, and at least one measuring resistor through which the current to be measured flows, or at least one magnetic field detector (3) capable of detecting time independent magnetic fields arranged in the vicinity of said conductor (1), adapted to provide a second measurement signal proportional to the current to be measured, the device further comprising a circuit (7) including a low-pass filter to process and merge said first and second measurement signals to provide an output signal which is the image of the current to be measured.

23. A device according to claim 22, wherein said coil is a Rogowski coil and said magnetic field detector is a Hall effect detector or a magneto-resistive element.

24. A device according to claim 22, comprising a plurality of magnetic field detecting elements arranged regularly around said electric conductor.

25. A device according to claim 23, comprising a plurality of magnetic field detecting elements arranged around said electric conductor.

26. A device according to claim 25, wherein said Rogowski coil is realized on a substrate carrying electric conductors forming a regular coil around a central opening and a substantially circular median return coil, the magnetic field detectors being assembled on the same substrate as the coil.

27. A device according to claim 26, wherein said substrate comprises a shielding conductor surrounding said opening passage without forming a complete loop.

28. A device according to claim 27, wherein said shielding conductor is connected to conducting portions extending across said substrate.

29. A device according to claim 26, wherein said substrate is formed from at least two juxtaposed layers carrying the winding turns of the Rogowski coil, the return conductor of the latter being arranged along the inside of the turns, in the plane of contact of the two layers.

30. A device according to claim 26, wherein said conductors form an integral assembly adapted to enable the substrate to be opened for inserting the conductor of the current to be measured.

31. A device according to claim 22, comprising an adding device forming the sum of said measurement signals, the output of this adding device being connected to the first input of a subtracting device, the output of this subtracting device being connected to an integrating device, the signal appearing at the output of this integrating device being coupled, through said low-pass filter, to a second input of said subtracting device, so as to form a control loop such that the output signal of the measuring device appearing at the output of the integrator is proportional to the intensity of current.

32. A device according to claim 22, comprising a first amplification and low-pass filter connected to the output of said field detector or to the terminals of said measuring resistor, to provide said first measurement signal, an integrating device whose output is connected to said low-pass filter, and an adding/subtracting device whose output is connected to the input of said integrating device and whose inputs are connected, respectively, to the output of said first amplification and low-pass filter, and to the output of said low-pass filter, and to the output of said coil providing the said second measurement signal, in such a way as to form a control loop, such that the output signal of the measuring device appearing at the output of the integrator is proportional to the intensity of the current.

33. A device according to claim 22, comprising an adding device of said measurement signals, as the case may be after an appropriate amplification or reduction of one and/or of the other of these signals, and said low-pass filter connected to the output of said adding device, the amplifications or reductions of measurement signals and the time constant of said low-pass filter being chosen in such a way that the output signal of the low-pass filter is proportional to the intensity of the current.

34. A device according to claim 22, wherein said low-pass filter is connected to the output of said measuring coil, said circuit further comprising a signal adding device and at least one amplification or reduction device arranged between the output of said low-pass filter and a first input of said adding device and/or between the output of said magnetic field detector and a second input of said adding device, the amplifications and reductions and the time constant of said low-pass filter being chosen in such a way that the output signal of the adding device is proportional to the intensity of the current to be measured.

35. A device according to claim 33, wherein said magnetic field detector has a corner frequency lower than the resonance frequency of said measuring coil.

36. A device according to claim 34, wherein said magnetic field detector has a corner frequency lower than the resonance frequency of said measuring coil.

* * * * *

UNITED STATES PATENT AND TRADEMARK OFFICE
CERTIFICATE OF CORRECTION

PATENT NO. : 6,366,076 B1
DATED : April 2, 2002
INVENTOR(S) : Nicolas Karrer and Patrick Hofer-Noser It is certified that error appears in the above-identified patent and that said Letters Patent is hereby corrected as shown below:

<u>Title page,</u>
Item [73], Assignee, please delete "Liaisons Electroniques-Mecaniques LEM SA, Plan-les-Ouates (CH)" and insert in lieu thereof -- Arbeitsgemeinschaft Prof. Hugel AGPH, Zurich (CH) --.

Signed and Sealed this

Fifth Day of November, 2002

Attest:

Attesting Officer

JAMES E. ROGAN
*Director of the United States Patent and Trademark Office*